United States Patent
Chen et al.

(10) Patent No.: US 11,233,116 B2
(45) Date of Patent: Jan. 25, 2022

(54) SEMICONDUCTOR DEVICE STRUCTURE WITH MAGNETIC ELEMENT

(71) Applicant: Taiwan Semiconductor Manufacturing Co., Ltd., Hsinchu (TW)

(72) Inventors: Chi-Cheng Chen, Tainan (TW); Wei-Li Huang, Pingtung (TW); Chien-Chih Kuo, Tainan (TW); Hon-Lin Huang, Hsinchu (TW); Chin-Yu Ku, Hsinchu (TW); Chen-Shien Chen, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/933,062

(22) Filed: Jul. 20, 2020

(65) Prior Publication Data

US 2020/0350395 A1    Nov. 5, 2020

Related U.S. Application Data

(63) Continuation of application No. 16/260,599, filed on Jan. 29, 2019, now Pat. No. 10,756,162.
(Continued)

(51) Int. Cl.
*H01L 49/02* (2006.01)
*H01F 41/04* (2006.01)
(Continued)

(52) U.S. Cl.
CPC ......... *H01L 28/10* (2013.01); *H01F 41/046* (2013.01); *H01L 21/76823* (2013.01);
(Continued)

(58) Field of Classification Search
CPC ...................................................... H01L 43/08
See application file for complete search history.

(56) References Cited

U.S. PATENT DOCUMENTS 7,470,927 B2   12/2008   Lee et al.
9,691,544 B2    6/2017   Sun
(Continued)

OTHER PUBLICATIONS

U.S. Office Action for U.S. Appl. No. 16/432,625, dated Dec. 9, 2020.

*Primary Examiner* — Thao P Le
(74) *Attorney, Agent, or Firm* — Birch, Stewart, Kolasch & Birch, LLP

(57) ABSTRACT

A semiconductor device structure is provided. The semiconductor device structure includes a semiconductor substrate and a magnetic element over the semiconductor substrate. The magnetic element has a first edge. The semiconductor device structure also includes an adhesive element between the magnetic element and the semiconductor substrate, and the adhesive element has a second edge. The semiconductor device structure further includes an isolation element extending across the magnetic element. The isolation element partially covers a top surface of the magnetic element and partially covers sidewall surfaces of the magnetic element. The isolation element has a third edge, and the second edge is closer to the third edge than the first edge. In addition, the semiconductor device structure includes a conductive line over the isolation element.

20 Claims, 13 Drawing Sheets

Related U.S. Application Data

(60) Provisional application No. 62/725,695, filed on Aug. 31, 2018.

(51) Int. Cl.
*H01L 23/00* (2006.01)
*H01L 21/768* (2006.01)
*H01L 23/31* (2006.01)
*H01L 23/532* (2006.01)

(52) U.S. Cl.
CPC ...... *H01L 23/3114* (2013.01); *H01L 23/3171* (2013.01); *H01L 23/53204* (2013.01); *H01L 24/05* (2013.01); *H01L 24/32* (2013.01); *H01L 24/48* (2013.01); *H01L 2224/04042* (2013.01); *H01L 2224/04073* (2013.01); *H01L 2224/05* (2013.01)

(56) References Cited

U.S. PATENT DOCUMENTS

| | | |
|---|---|---|
| 2004/0021382 A1* | 2/2004 | Steinmeyer ............. F16C 33/72 310/90.5 |
| 2009/0050991 A1 | 2/2009 | Nagai et al. |
| 2012/0181640 A1* | 7/2012 | von Koblinski .... H01L 23/3178 257/421 |
| 2014/0167193 A1 | 6/2014 | Iuliano et al. |
| 2015/0311901 A1 | 10/2015 | Bromberg et al. |
| 2017/0365755 A1* | 12/2017 | Chu ........................ H01L 33/36 |
| 2018/0366536 A1 | 12/2018 | Hsu et al. |
| 2019/0203564 A1 | 7/2019 | Henschel, Jr. et al. |
| 2020/0006465 A1* | 1/2020 | Ku .......................... H01L 28/10 |

* cited by examiner

SEMICONDUCTOR DEVICE STRUCTURE WITH MAGNETIC ELEMENT

PRIORITY CLAIM AND CROSS-REFERENCE

This Application is a Continuation application of U.S. patent application Ser. No. 16/260,599, filed on Jan. 29, 2019, which claims the benefit of U.S. Provisional Application No. 62/725,695, filed on Aug. 31, 2018, the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
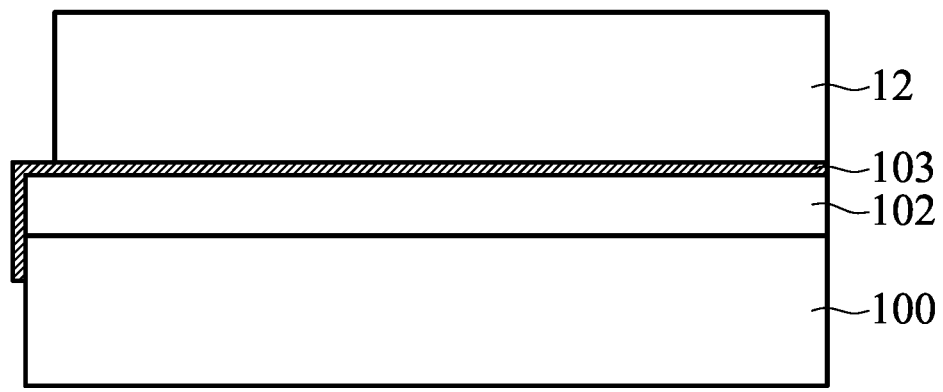
FIGS. 1A-1M are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1M are cross-sectional views of various stages of a process for forming a semiconductor device structure, in accordance with some embodiments. As shown in FIG. 1A, a semiconductor substrate 100 is received or provided. The semiconductor substrate 100 may include a semiconductor wafer with multiple device elements formed therein. For example, the semiconductor substrate 100 is a silicon wafer with transistors formed therein.

In some embodiments, an interconnection structure 102 is formed over the semiconductor substrate 100. The interconnection structure 102 may include multiple dielectric layers and multiple conductive features. These conductive features form electrical connections between the device elements and other elements to be formed later. In some embodiments, the topmost dielectric layer of the interconnection structure 102 is made of or includes a polymer material. For example, the polymer material is polyimide or another suitable material.

As shown in FIG. 1A, an adhesive layer 103 is deposited over the interconnection structure 102, in accordance with some embodiments. The adhesive layer 103 may be used to improve adhesion between the interconnection structure 102 and a subsequently formed element. In some embodiments, the adhesive layer 103 further extends onto a sidewall of the interconnection structure 102. The adhesive layer 103 further extends onto a sidewall of the semiconductor substrate 100.

In some embodiments, the adhesive layer 103 is made of or includes a metal material. The metal material may include titanium, aluminum, copper, one or more other suitable materials, or a combination thereof. For example, the metal material may include a substantially pure metal material (such as titanium) or an alloy such as a combination of copper and aluminum. The thickness of the adhesive layer 103 may be in a range from about 500 Å to about 1000 Å.

The adhesive layer 103 may be deposited using a physical vapor deposition (PVD) process, a chemical vapor deposition (CVD) process, an atomic layer deposition (ALD) process, an electroplating process, an electroless plating process, one or more other applicable processes, or a combination thereof.

Afterwards, a mask element 12 is formed over the adhesive layer 103, as shown in FIG. 1A in accordance with some embodiments. In some embodiments, the mask element 12 covers an inner portion of the adhesive layer 103. The adhesive layer 103 has an outer portion that surrounds the inner portion. The outer portion of the adhesive layer 103 positioned over a peripheral region of the semiconductor substrate 100 is exposed. The mask element 12 may be a patterned photoresist layer. A photolithography process may be used to form the mask element 12.

Figure 1B:
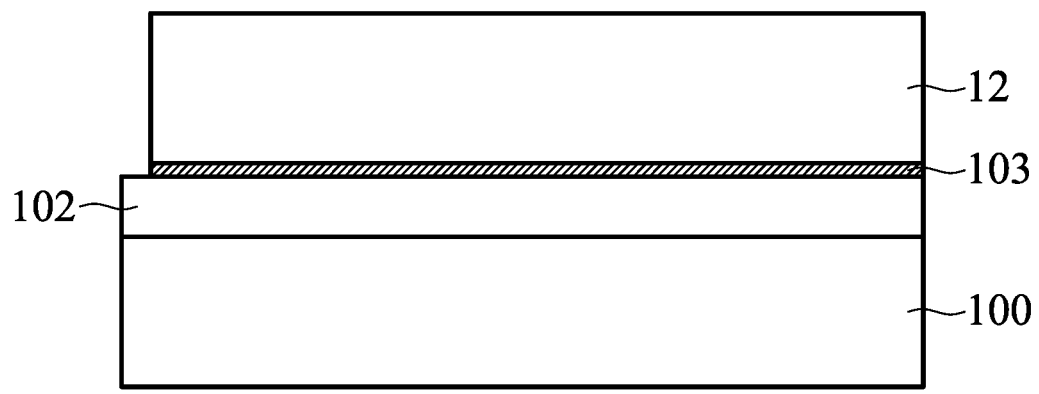

As shown in FIG. 1B, the exposed portion of the adhesive layer 103 is removed, in accordance with some embodiments. In some embodiments, the exposed portion (the outer portion) of the adhesive layer 103 is removed using an etching process with the mask element 12 as an etching mask.

Figure 1C:
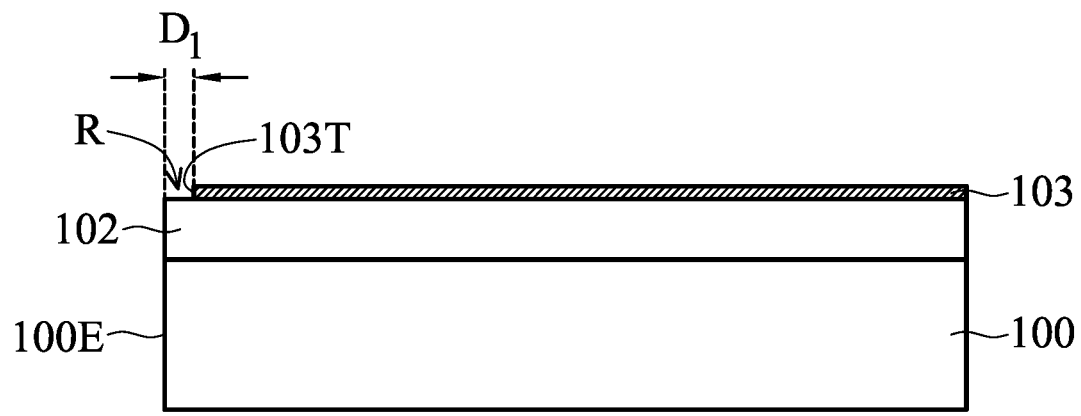

Afterwards, the mask element is removed, as shown in FIG. 1C in accordance with some embodiments. After the removal of the outer portion of the adhesive layer 103, a peripheral region R of the interconnection structure 102 is exposed. A terminal 103T of the remaining portion of the adhesive layer 103 is formed. The terminal 103T is laterally spaced from an edge 100E of the semiconductor substrate 100 by a distance $D_1$.

Figure 7:
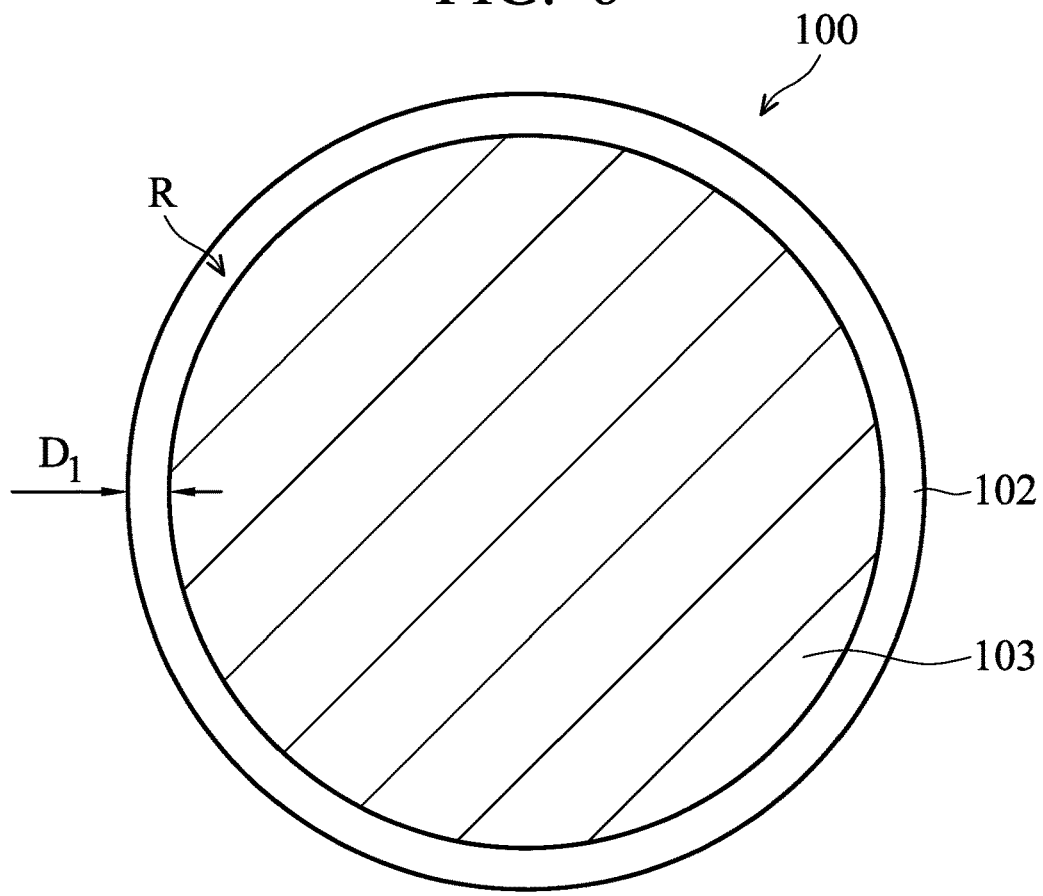
FIG. 7 is a top view of an intermediate stage of a process for forming a semiconductor device structure, in accordance with some embodiments.

FIG. 7 is a top view of an intermediate stage of a process for forming a semiconductor device structure, in accordance with some embodiments. In some embodiments, FIG. 7 shows the top view of the structure shown in FIG. 1C. FIG. 7 also shows the top view of other portions that are not shown in FIG. 1C. In some embodiments, the semiconductor substrate 100 is a semiconductor wafer. The peripheral region R of the interconnection structure 102 laterally surrounds the adhesive layer 103. In some embodiments, the distance $D_1$ is in a range from about 1000 μm to about 2000 μm. In some other embodiments, the distance $D_1$ is in a range from about 1500 μm to about 1800 μm.

In some embodiments, because the outer portion of the adhesive layer 103 is removed, an etchant used during a subsequent process for forming a magnetic element is prevented from reaching the adhesive layer 103 below the magnetic element. A peeling issue between material layers is prevented from occurring near the peripheral region of the semiconductor substrate 100. In some cases where the distance $D_1$ is less than about 1000 μm, the peeling issue may still occur. In some other cases where the distance $D_1$ is greater than about 2000 μm, the outer region R may take up too much space. As a result, the number of the device elements that can be formed is reduced.

Figure 1D:
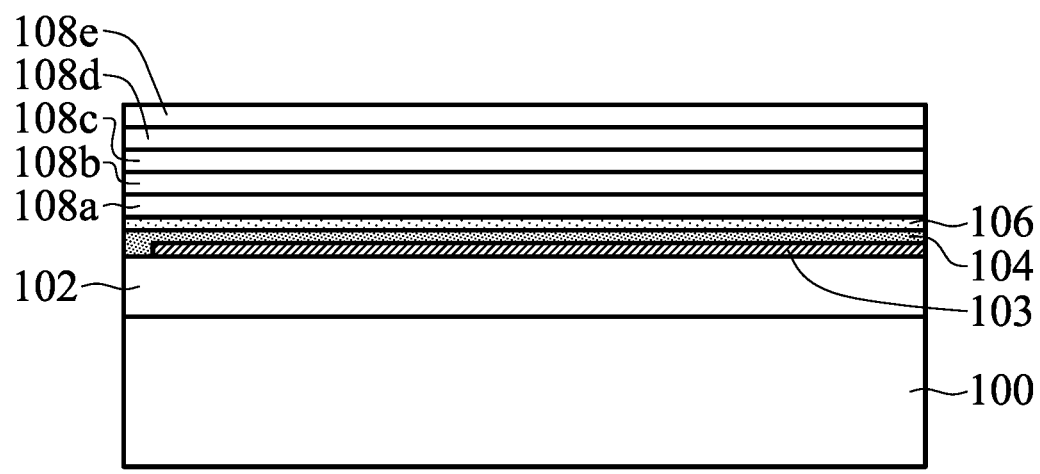

As shown in FIG. 1D, a protective layer 104 is deposited over the adhesive layer 103 and the interconnection structure 102, in accordance with some embodiments. The protective layer 104 may be used to protect the interconnection structure 102 during a subsequent etching process for improving the quality of magnetic elements. In some embodiments, the protective layer 104 is in direct contact with the adhesive layer 103 and the interconnection structure 102. In some other embodiments, one or more other material layers are formed between the protective layer 104 and the adhesive layer 103 or between the protective layer 104 and the interconnection structure 102.

In some embodiments, the protective layer 104 is a single layer. In some other embodiments, the protective layer 104 includes multiple sub-layers. The sub-layers may be made of the same material. Alternatively, some of the sub-layers are made of different materials.

The protective layer 104 may be made of or include silicon nitride, silicon oxide, silicon oxynitride, silicon carbide, one or more other suitable materials, or a combination thereof. The protective layer 104 may be deposited using a chemical vapor deposition (CVD) process, an atomic layer deposition (ALD) process, a physical vapor deposition (PVD) process, a spin-on process, one or more other applicable processes, or a combination thereof.

The protective layer 104 may have a thickness that is in a range from 0.1 μm to about 3 μm. In some cases, if the protective layer 104 is thinner than about 0.1 μm, the protective layer 104 may be too thin to protect the interconnection structure 102 underneath. In some other cases, if the protective layer 104 is thicker than about 3 μm, the stress of the protective layer 104 may be too high. The protective layer 104 may become broken or delaminated due to the high stress, which may negatively affect the quality and reliability of the semiconductor device structure.

However, many variations and/or modifications can be made to embodiments of the disclosure. In some other embodiments, the protective layer 104 is not formed.

As shown in FIG. 1D, an etch stop layer 106 is deposited over the protective layer 104, in accordance with some embodiments. The etch stop layer 106 may protect the protective layer 104, the adhesive layer 103, and the interconnection structure 102 thereunder from being damaged during a subsequent etching process for forming magnetic elements. In some embodiments, the etch stop layer 106 is a single layer. In some other embodiments, etch stop layer 106 includes multiple sub-layers. The sub-layers may be made of the same material. Alternatively, some of the sub-layers are made of different materials.

In some embodiments, the etch stop layer 106 and the protective layer 104 are made of different materials. The etch stop layer 106 may be made of or include tantalum oxide, zirconium oxide, tantalum nitride, one or more other suitable materials, or a combination thereof. In some embodiments, the etch stop layer 106 is deposited using a CVD process, an ALD process, a PVD process, one or more other applicable processes, or a combination thereof. In some other embodiments, a metal layer is deposited over the interconnection structure 102. Afterwards, an oxidation process and/or a nitridation process are used to transform the metal layer into the protective layer 104.

As shown in FIG. 1D, two or more magnetic layers (such as magnetic layers 108a-108e) are sequentially deposited over the etch stop layer 106, in accordance with some embodiments. These magnetic layers 108a-108e will be patterned later to form one or more magnetic elements. In some embodiments, the magnetic layers 108a-108e are made of the same material. In some other embodiments, some of the magnetic layers 108a-108e are made of different materials. In some embodiments, each of the magnetic layers 108a-108e has the same thickness. In some other embodiments, some of the magnetic layers 108a-108e have different thicknesses.

In some embodiments, the magnetic layers 108a-108e contain cobalt, zirconium, tantalum, iron, nickel, one or more other elements, or a combination thereof. The magnetic layers 108a-108e may be made of or include an alloy containing cobalt, zirconium, and tantalum (CZT), an alloy containing cobalt and zirconium, an alloy containing iron and nickel, one or more other suitable materials, or a combination thereof. The magnetic layers 108a-108e may be deposited using a PVD process, a CVD process, an ALD process, an electroplating process, an electroless plating process, one or more other applicable processes, or a combination thereof.

Figure 1E:
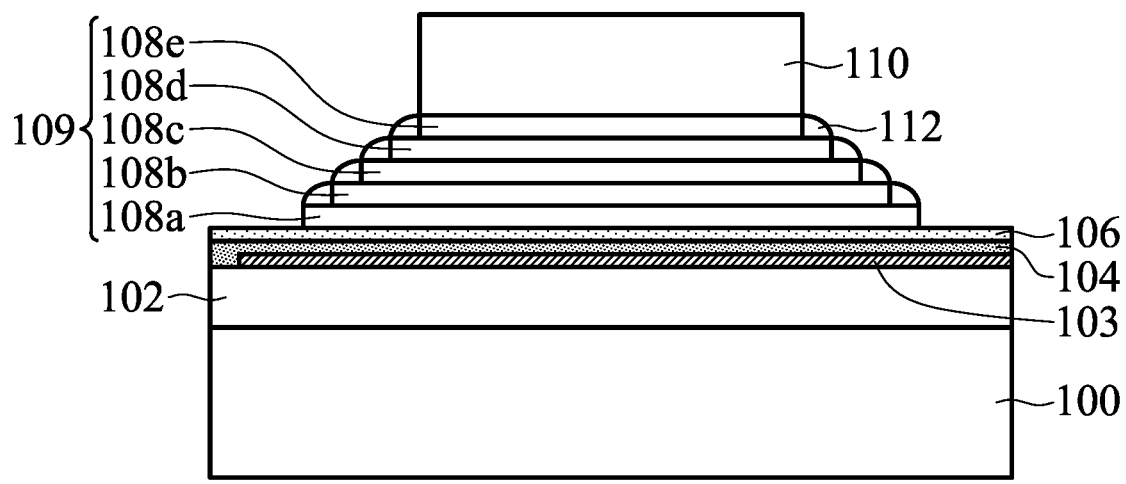

As shown in FIG. 1E, a patterned mask layer 110 is formed over the magnetic layer 108e, in accordance with some embodiments. The patterned mask layer 110 is used to assist in a subsequent patterning process of the magnetic layers 108a-108e. In some embodiments, the patterned mask layer 110 is a patterned photoresist layer. A photolithography process may be used to form the patterned mask layer 110 with the desired pattern. For example, the top view of the patterned mask layer 110 may have a square shape, a rectangular shape, or another suitable shape.

Afterwards, the magnetic layers 108a-108e are partially removed, as shown in FIG. 1E in accordance with some embodiments. As a result, the remaining portions of the magnetic layers 108a-108e together form a magnetic element 109. In some embodiments, with the patterned mask layer 110 as an etching mask, an etching process is used to partially remove the magnetic layers 108a-108e. In some embodiments, the etching process is a wet etching process. The etchant used in the wet etching process may include nitric acid, hydrochloric acid, hydrofluoric acid, one or more other suitable etchants, or a combination thereof. For example, a mixture of nitric acid, hydrochloric acid, and hydrofluoric acid is used as the etchant in the wet etching process. The etch stop layer 106 and the protective layer 104 may protect the interconnection structure 102 and the adhesive layer 103 from being damaged during the wet etching process for patterning the magnetic layers 108a-108e.

In some cases, due to the characteristics of the magnetic layers 108a-108e and the wet etching process, hollow structures 112 may be formed at sidewalls surfaces of the magnetic element 109, as shown in FIG. 1E. The hollow structures 112 may include voids inside, which may negatively affect the quality and reliability of the formed magnetic element 109.

Figure 1F:
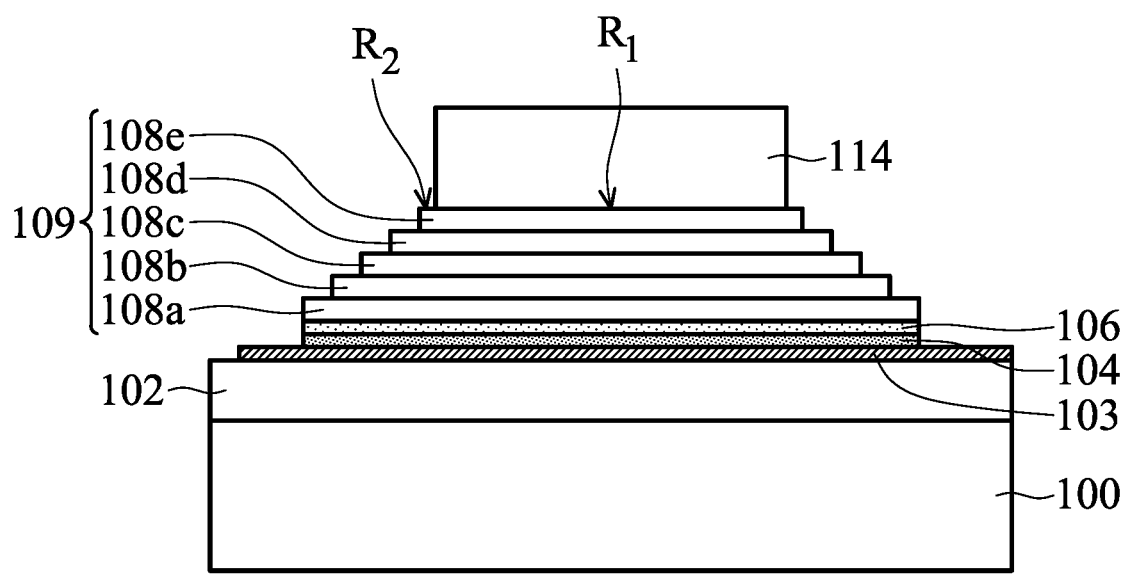

As shown in FIG. 1F, the mask element 110 is removed, and a new mask element 114 is then formed to partially cover the top surface of the magnetic element 109, in accordance with some embodiments. The material and formation method of the mask element 114 may be the same as or similar to those of the patterned mask layer 110. In some embodiments, the magnetic element 109 includes a stack of multiple magnetic layers 108a-108e. In some embodiments, the topmost magnetic layer (i.e., the magnetic layer 108e) is wider than the mask element 114.

In some embodiments, the mask element 114 covers a center region $R_1$ of the topmost magnetic layer 108e, as shown in FIG. 1F. The topmost magnetic layer 108e has a periphery region $R_2$ that is not covered by the mask element 114. The periphery region $R_2$ of the topmost magnetic layer 108e surrounds the center region $R_1$ of the topmost magnetic layer 108e.

Afterwards, an etching process is performed to partially remove the magnetic element 109, as shown in FIG. 1F in accordance with some embodiments. In some embodiments, the etching process is a dry etching process that is capable of removing the hollow structures 112 (including voids) at the sidewall surfaces of the magnetic element 109. The etchant used in the dry etching process may include $CF_4$ or another suitable etchant. In some embodiments, due to the protection of the protective layer 104, the dry etching process is performed for a longer period of time to ensure a complete removal of the hollow structures 112. Since the hollow structures 112 are removed, the quality and reliability of the magnetic element 109 are improved.

In some embodiments, the etching process used for removing the hollow structures 112 also partially remove the etch stop layer 106 and the protective layer 104. Alternatively, another etching process is used to remove the protective layer 104 or the etch stop layer 106. As a result, a portion of the interconnection structure 102 and a portion of the adhesive layer 103 are exposed, as shown in FIG. 1F in accordance with some embodiments. One or more conductive pads formed in the interconnection structure 102 may be exposed. Other conductive features such as redistribution layers may be formed later to connect the exposed conductive pads.

Figure 1G:
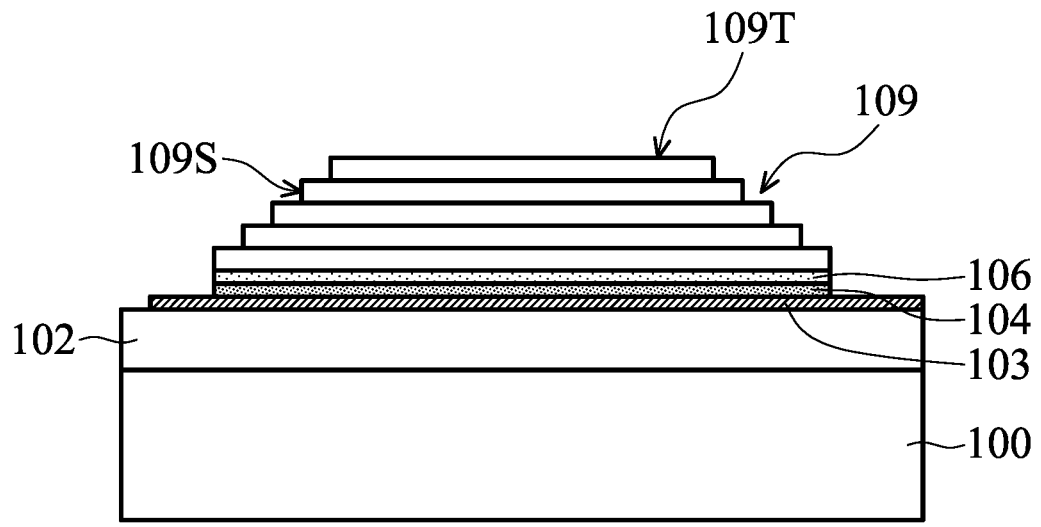

Afterwards, the mask element 114 is removed to expose the top surface 109T of the magnetic element 109, as shown in FIG. 1G in accordance with some embodiments. As shown in FIG. 1G, sidewall surfaces 109S of the magnetic element 109 have stair-like profiles.

Figure 3A:
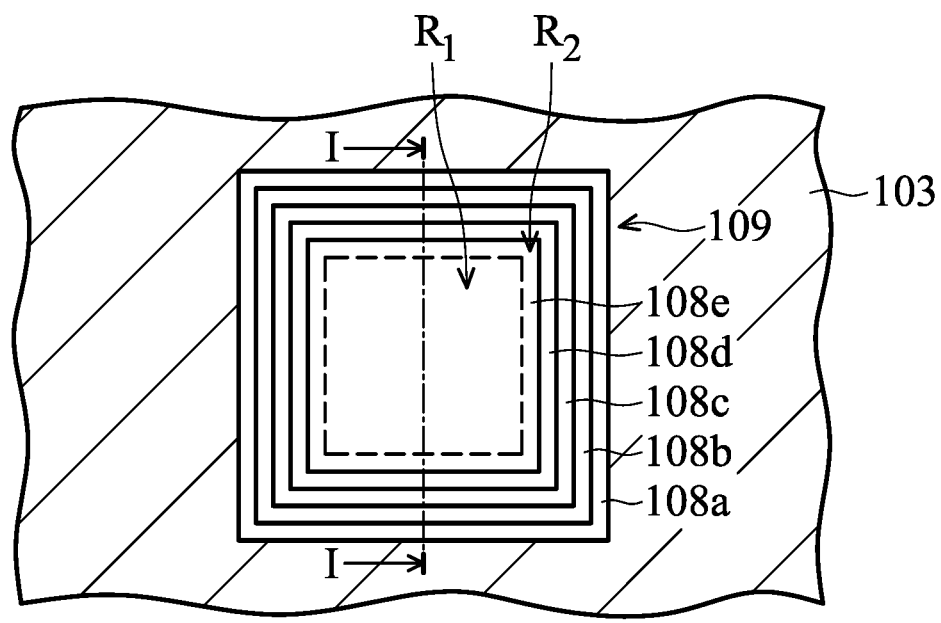
FIGS. 3A-3D are top layout views of various stages of a process for forming a semiconductor device structure, in accordance with some embodiments.

FIGS. 3A-3D are top layout views of various stages of a process for forming a semiconductor device structure, in accordance with some embodiments. In some embodiments, FIG. 3A is a top view layout view of the structure shown in FIG. 1G. In some embodiments, the structure shown in FIG. 1G is taken along line I-I in FIG. 3A.

In some embodiments, the magnetic element 109 has multiple sub-layers such as the magnetic layers 108a-108e. In some embodiments, each sub-layers is larger than another sub-layer above it, as shown in FIGS. 1G and 3A. For example, the magnetic layer 108a is larger than the magnetic layer 108b. Similarly, the magnetic layer 108d is larger than the magnetic layer 108e.

Figure 1H:
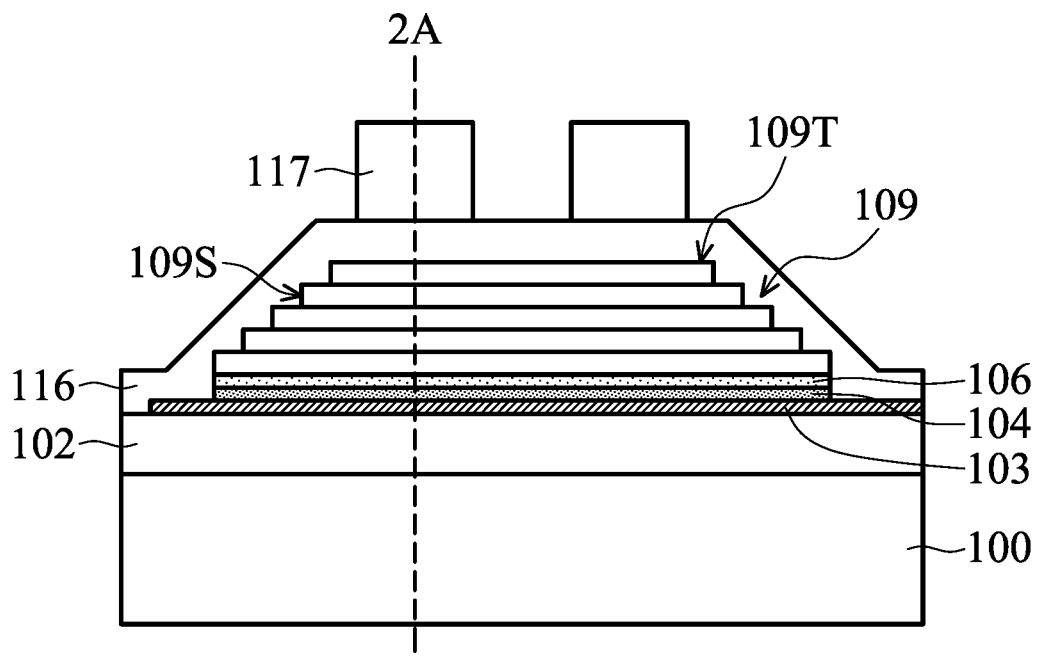

As shown in FIG. 1H, an isolation layer 116 is deposited over the interconnection structure 102, the adhesive layer 103, and the magnetic element 109, in accordance with some embodiments. The isolation layer 116 may be made of or include silicon nitride, silicon oxide, silicon oxynitride, one or more other suitable dielectric materials, or a combination thereof. The isolation layer 116 may be deposited using a CVD process, an ALD process, a PVD process, one or more other applicable processes, or a combination thereof.

In some embodiments, the adhesion between the materials of the isolation layer 116 and the adhesive layer 103 is greater than the adhesion between the materials of the isolation layer 116 and the interconnection structure 102. In some embodiments, the isolation layer 116 is in direct contact with the adhesive layer 103.

In some other cases where the adhesive layer 103 is not formed, a delamination may occur at the position that is between the isolation layer 116 and the interconnection structure 102 and near the magnetic element 109. Alternatively, a conductive pad formed in the interconnection structure 102 may be damaged due to the high stress of the isolation layer 116. For example, the isolation layer 116 may shrink and cause delamination between the isolation layer 116 and a polyimide layer of the interconnection structure 102. The isolation layer 116 may also be broken.

Afterwards, mask elements 117 are formed over the isolation layer 116, as shown in FIG. 1H in accordance with some embodiments. The mask elements 117 are used to assist in a subsequent patterning process of the isolation layer 116. The material and formation method of the mask elements 117 may be the same as or similar to those of the mask element 114.

Figure 2A:
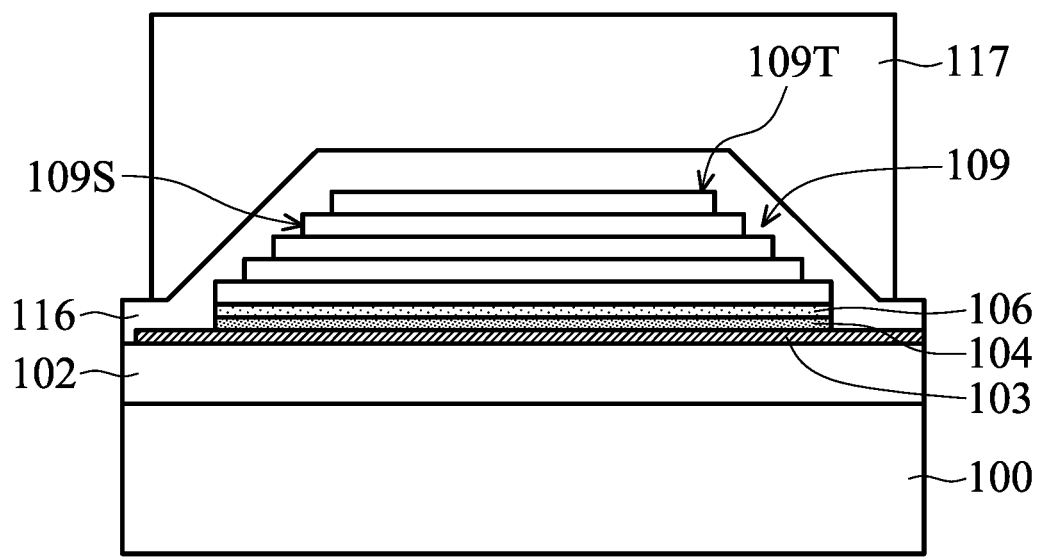
FIGS. 2A-2E are cross-sectional views of various stages of a process for forming a semiconductor device structure, in accordance with some embodiments.

FIGS. 2A-2E are cross-sectional views of various stages of a process for forming a semiconductor device structure, in accordance with some embodiments. FIG. 2A may show another cross-sectional view of the structure shown in FIG. 1H when taken along the line 2A in FIG. 1H. In some embodiments, the mask element 117 extends across the magnetic element 109, as shown in FIG. 2A.

Figure 1I:
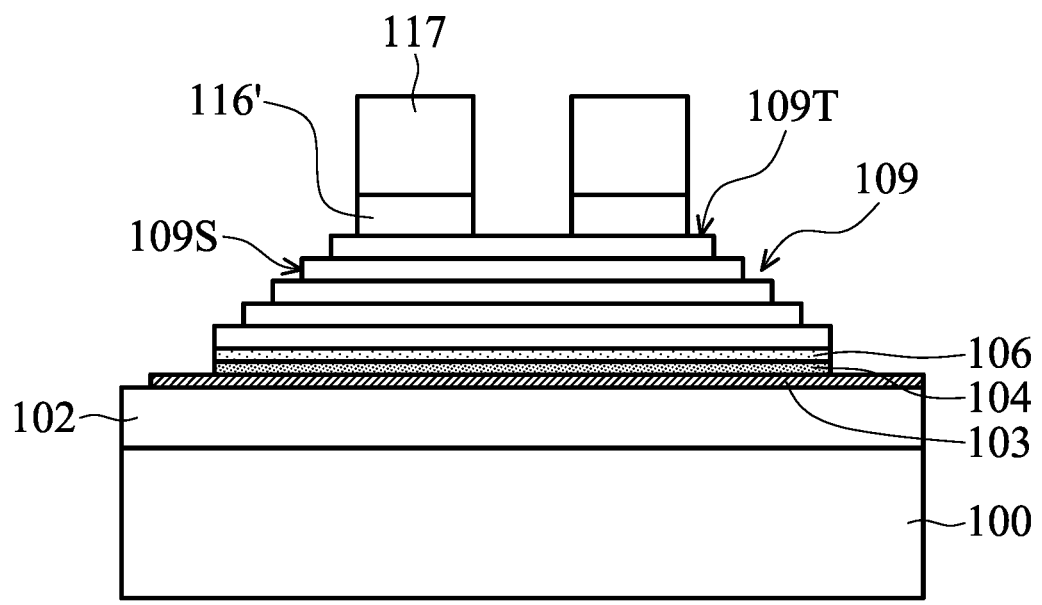

As shown in FIG. 1I, the isolation layer 116 is partially removed, in accordance with some embodiments. The mask elements 117 may be used as an etching mask, and an etching process is used to remove the isolation layer 116 not covered by the mask elements 117. As a result, the remaining portions of the isolation layer 116 form isolation elements 116', as shown in FIG. 1I. After the partial removal of the isolation layer 116, the adhesive layer 103 is partially exposed, as shown in FIG. 1I.

Figure 1J:
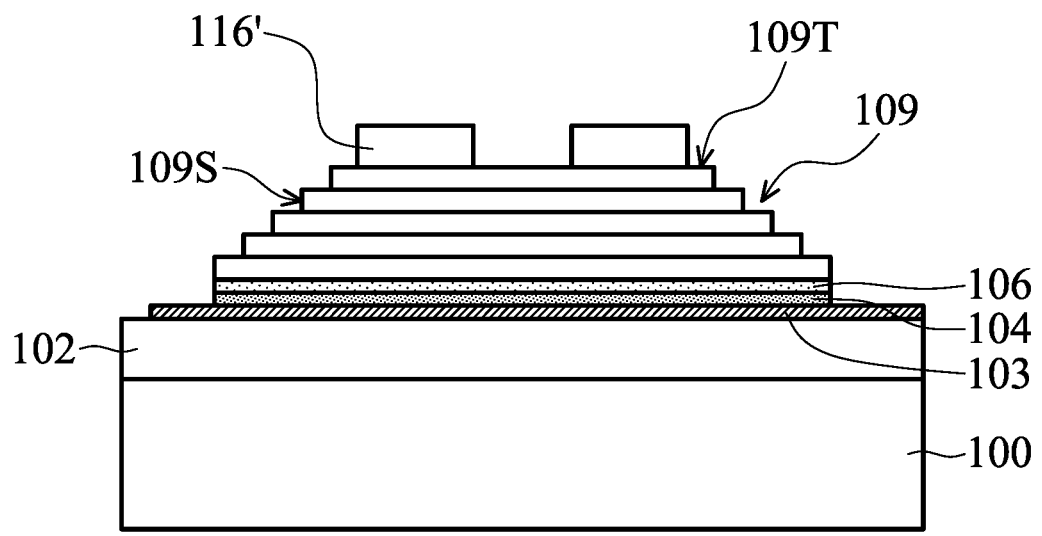
Figure 2B:
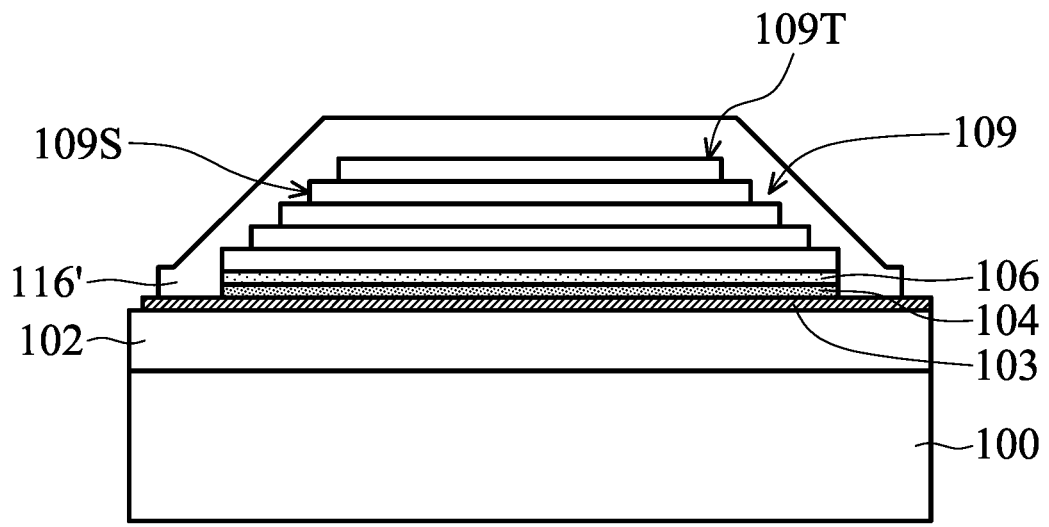
Figure 3B:
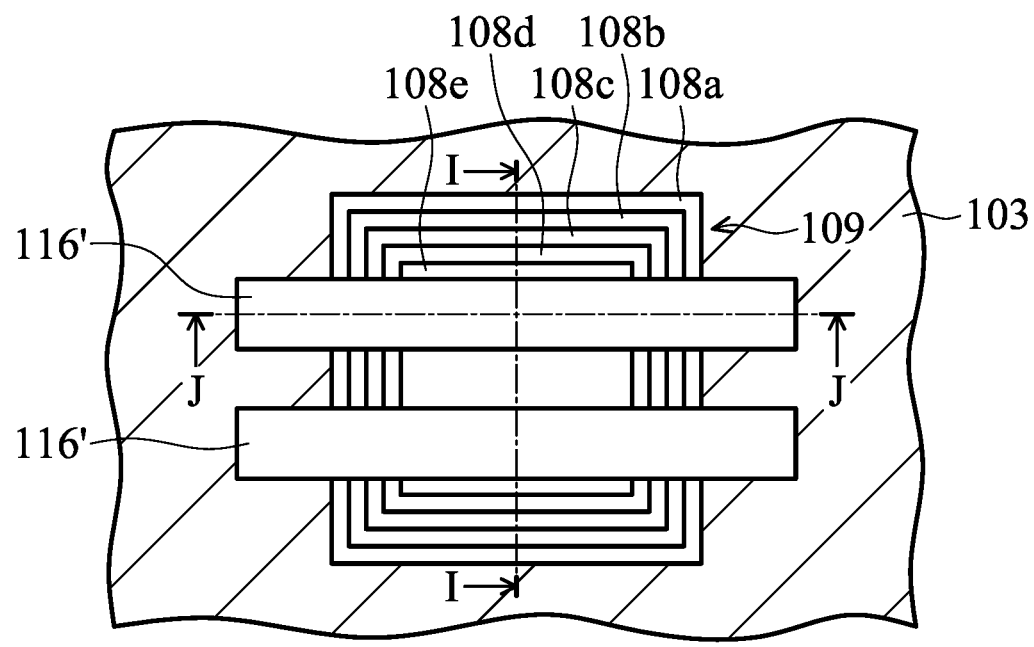

As shown in FIGS. 1J and 2B, the mask elements 117 are then removed, in accordance with some embodiments. In some embodiments, FIG. 3B is a top view layout view of the structure shown in FIGS. 1J and 2B. In some embodiments, the structure shown in FIG. 1J is taken along line I-I in FIG. 3B. In some embodiments, the structure shown in FIG. 2B is taken along line J-J in FIG. 3B.

In some embodiments, each of the isolation elements 116' extends across the magnetic element 109. In some embodiments, each of the isolation elements 116' partially covers the top surface 109T of the magnetic element 109. A portion of the top surface 109T is not covered by the isolation elements 116', as shown in FIGS. 1J and 3B. In some embodiments, each of the isolation elements 116' partially covers the sidewall surfaces 109S of the magnetic element 109. A portion of the sidewall surfaces 109S is not covered by the isolation elements 116'.

Figure 1K:
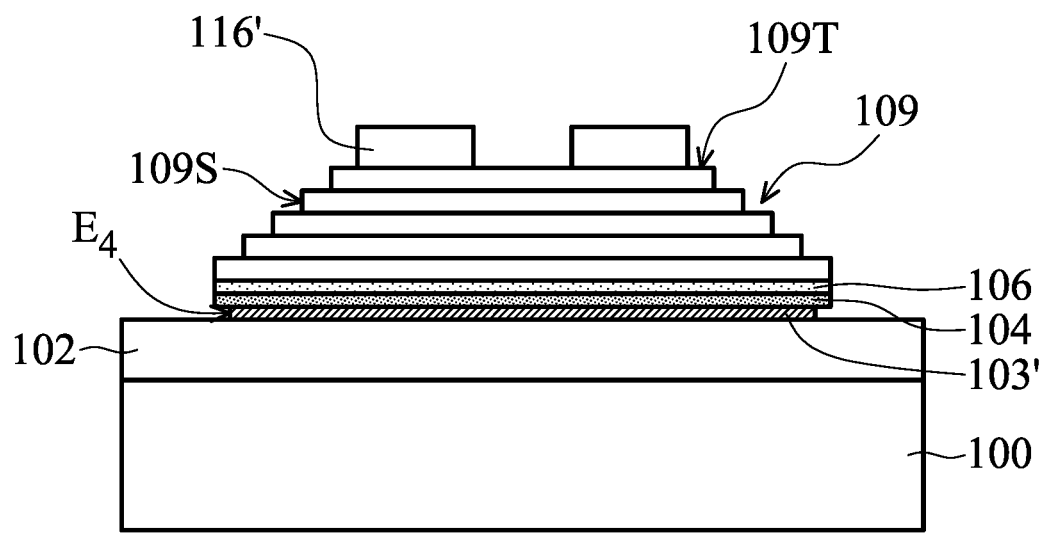
Figure 2C:
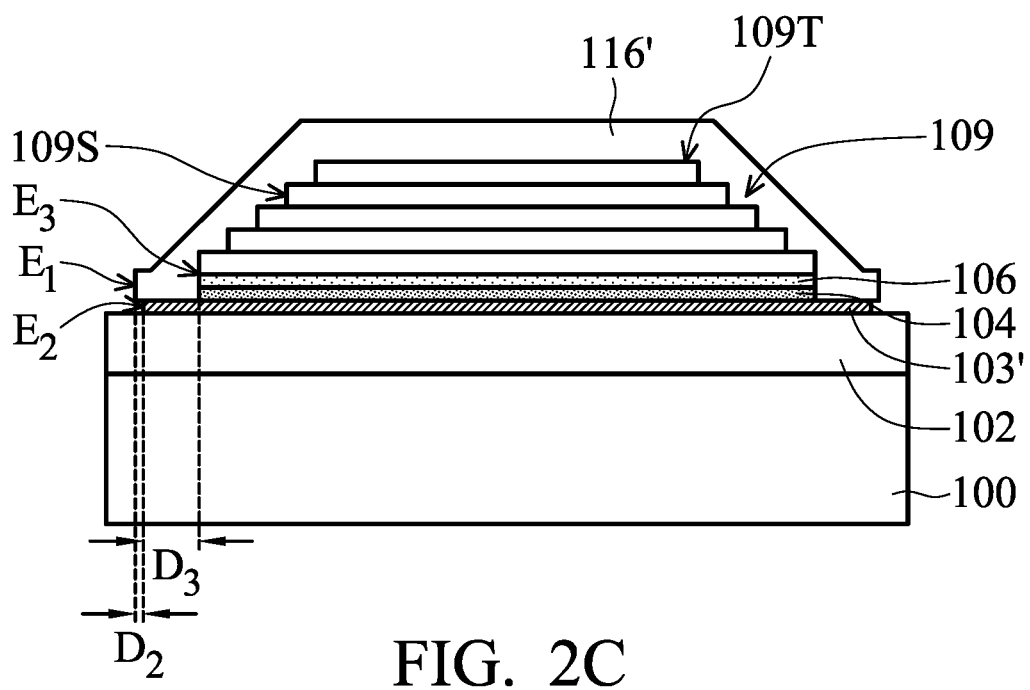
Figure 3C:
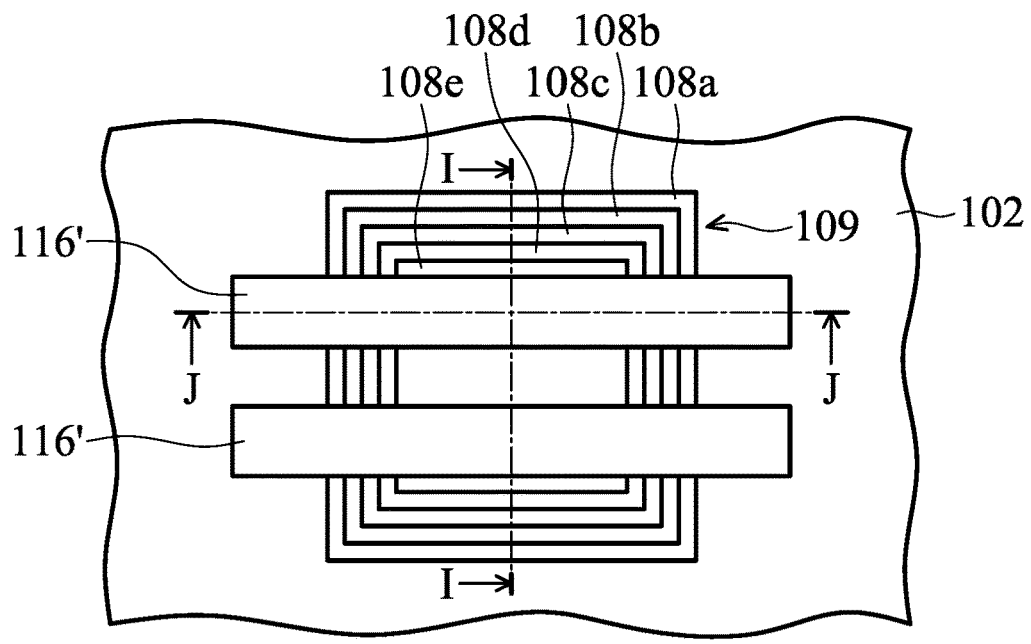

As shown in FIGS. 1K and 2C, the adhesive layer 103 is partially removed, in accordance with some embodiments. In some embodiments, FIG. 3C is a top view layout view of the structure shown in FIGS. 1K and 2C. In some embodiments, the structure shown in FIG. 1K is taken along line I-I in FIG. 3C. In some embodiments, the structure shown in FIG. 2C is taken along line J-J in FIG. 3C.

An etching process may be used to partially remove the adhesive layer 103. The exposed portions of the adhesive layer 103 are removed so that the portion of the interconnection structure 102 originally covered by the adhesive layer 103 is exposed, as shown in FIGS. 1K, 2B, and 3C. In some embodiments, portions of the adhesive layer 103 near the exposed portions are also removed. The remaining portion of the adhesive layer 103 forms an adhesive element 103'. In some embodiments, due to the partial removal of the adhesive layer 103, the obtained adhesive element 103' is prevented from being in electrical contact with a subsequently formed conductive line. Therefore, short-circuiting between the adhesive element 103' and the subsequently formed conductive line may be avoided.

In some embodiments, the adhesive layer 103 is partially removed to form the adhesive element 103' after the formation of the isolation layer 116 (or the isolation element 116'). The adhesive layer 103 interfaces the isolation layer 116 and the interconnection structure 102. The isolation layer 116 (or the isolation element 116') with high stress is prevented from being in direct contact with the polymer layer (such as a polyimide layer) of the interconnection structure 102. Therefore, the interconnection structure 102 is prevented from being damaged due to the high stress of the isolation layer 116 (or the isolation element 116').

In some other cases, the adhesive layer 103 is partially removed to form the adhesive element before the formation of the isolation layer 116 (or the isolation element 116'). A portion of the isolation layer 116 (or the isolation element 116') that has high stress may be in direct contact with the interconnection structure 102. As a result, the interconnection structure 102 may be damaged. For example, cracks or voids may be formed in the polymer layer (such as a polyimide layer) and/or the conductive pads of the interconnection structure 102.

In some embodiments, the adhesive element 103' is in direct contact with the isolation element 116' and the interconnection structure 102. The adhesive element 103' improves the adhesion between the isolation element 116' and the interconnection structure 102. In some other cases where the adhesive element 103' is not formed, delamination between the isolation element 116' and the interconnection structure 102 may occur. Cracks may be formed in the polymer (such as polyimide) layer of the interconnection structure 102 due to the high stress of the isolation element 116'.

In some embodiments, an edge $E_2$ of the adhesive element 103' is laterally disposed between an edge $E_3$ of the magnetic element 109 and an edge $E_1$ of the isolation element 116', as shown in FIG. 2C. In some embodiments, an edge $E_4$ of the adhesive element 103' is below the magnetic element 109, as shown in FIG. 1K.

As shown in FIG. 2C, the edge $E_2$ of the adhesive element 103' is laterally separated from the edge $E_1$ of the isolation element 116' by a distance $D_2$. The edge $E_2$ of the adhesive element 103' is laterally separated from the edge $E_3$ of the magnetic element 109 by a distance $D_3$. The distance $D_2$ may be in a range from about 50 Å to about 200 Å. In some embodiments, the distance $D_3$ is less than the distance $D_1$. In these cases, the distance $D_3$ may be in a range from about 40 Å to about 180 Å. In some other embodiments, the distance $D_3$ is greater than the distance $D_1$. In these cases, the distance $D_3$ may be in a range from about 60 Å to about 300 Å.

In some cases, if the distance $D_2$ is less than about 50 Å, the adhesive element 103' may be in electrical contact with the subsequently formed conductive line. As a result, short-circuiting may occur between the adhesive element 103' and the conductive line. In some other cases, if the distance $D_2$ is greater than about 200 Å, the isolation element 116' may not be sufficiently supported. Therefore, the isolation element 116' might be damaged.

Figure 1L:
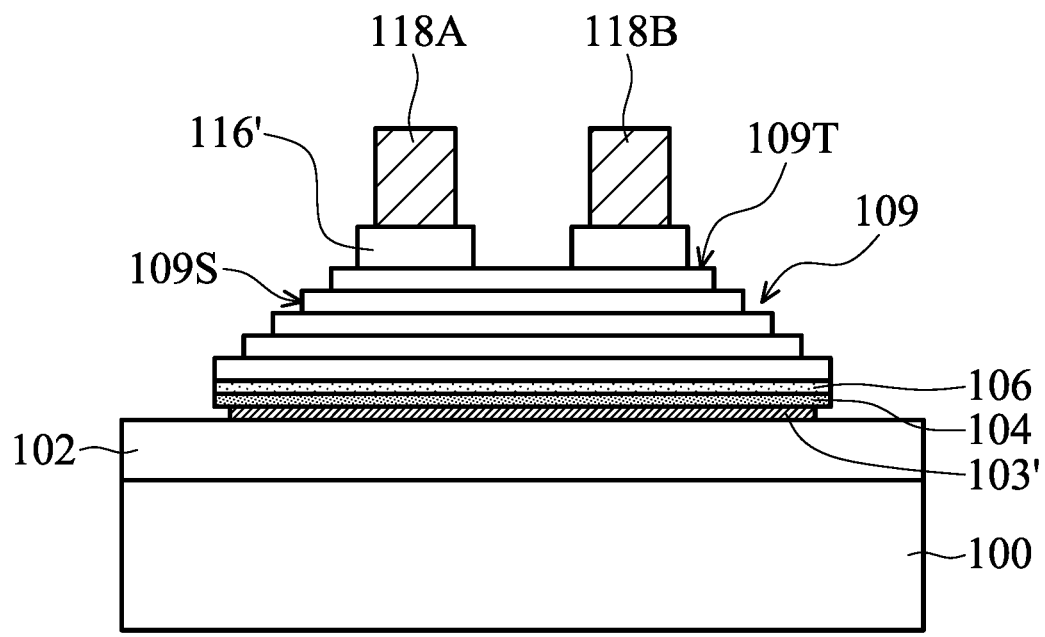
Figure 2D:
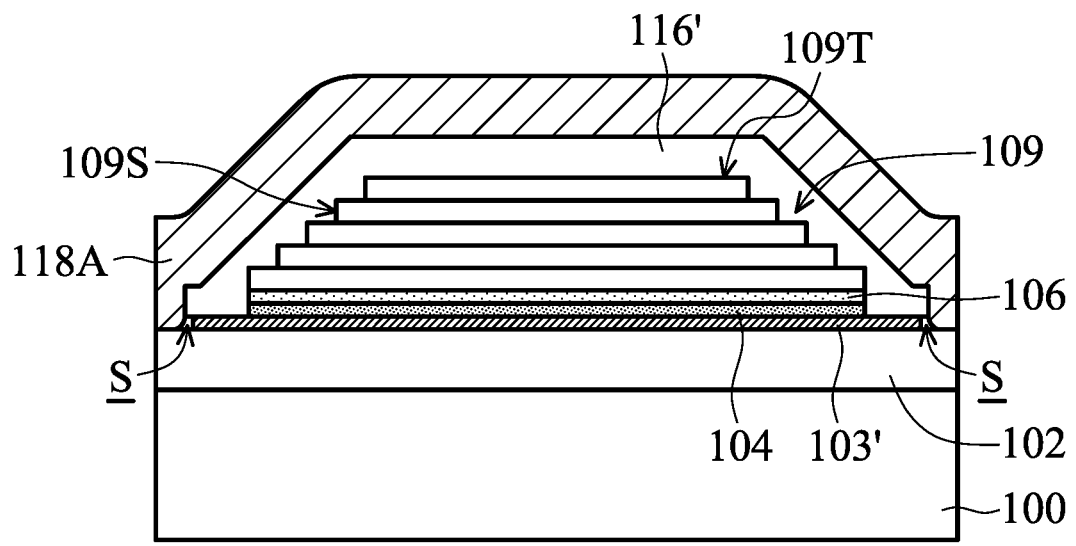
Figure 3D:
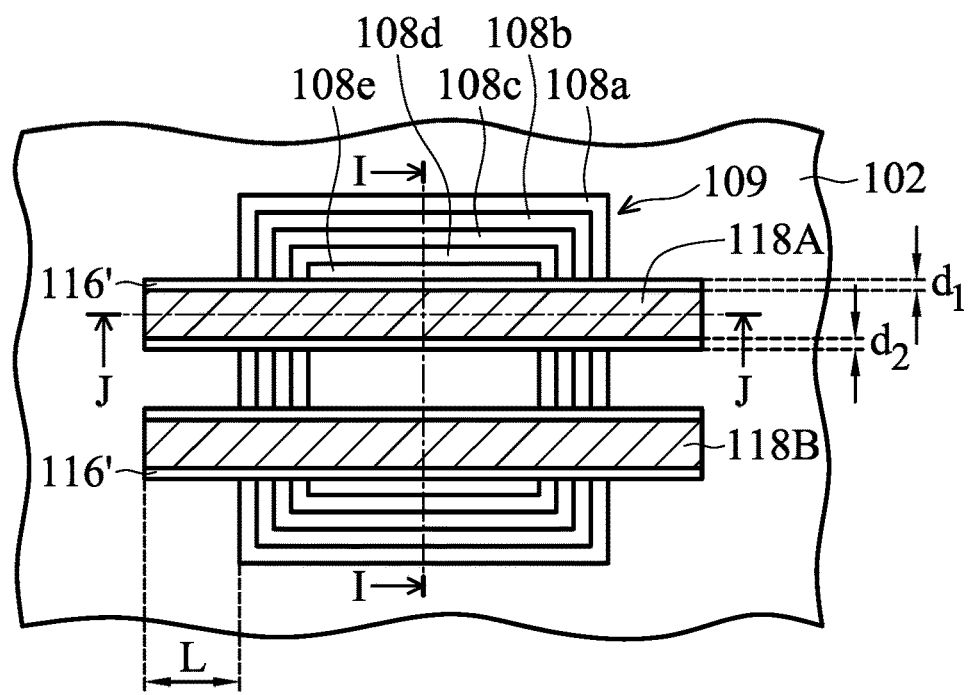

As shown in FIGS. 1L, 2D, and 3D, conductive lines 118A and 118B are formed over the isolation elements 116', in accordance with some embodiments. The isolation elements 116' physically separate the magnetic element 109 from the conductive lines 118A and 118B. In some embodiments, the conductive line 118A extends along an extending direction of the isolation element 116' thereunder. Similarly, the conductive line 118B also extends along an extending direction of the isolation element 116' thereunder.

In some embodiments, the conductive lines 118A and 118B are electrically connected to each other. In some embodiments, the conductive lines 118A and 118B are electrically connected to other conductive lines formed above and below the magnetic element 109. These conductive lines together surround the magnetic element 109. The conductive lines and the magnetic element 109 may together function as an inductor.

The conductive lines 118A and 118B may be made of or include copper, aluminum, gold, cobalt, platinum, one or more other suitable materials, or a combination thereof. In some embodiments, the conductive lines 118A and 118B are formed using an electroplating process. A seed layer is deposited first, and then a mask element is formed over the seed layer. In some embodiments, the seed layer is separated from the adhesive element 103' by a hole S.

The opening of the mask element defines the positions and profiles of the conductive lines. Then, one or more conductive material is electroplated on the exposed portions of the seed layer. Afterwards, the mask element is removed, and an etching process is used to remove the seed layer originally covered by the mask element. As a result, the conductive lines 118A and 118B are formed. As shown in FIG. 2D, the conductive line 118A is separated from the adhesive element 103' by the hole S. In some embodiments, the isolation element 116', the adhesive element 103', and the conductive line 118A together surround the hole S.

Many variations and/or modifications can be made to embodiments of the disclosure. In some other embodiments, a metal layer is deposited using a PVD process, a CVD process, one or more other applicable processes, or a combination thereof. Afterwards, a photolithography process and an etching process are used to pattern the metal layer into the conductive lines 118A and 118B.

In some embodiments, each of the isolation elements 116' is wider than the conductive line 118A or 118B formed thereon, as shown in FIGS. 1L and 3D. Therefore, even if an overlay shift occurs during the formation of the conductive lines 118A and 118B, the isolation elements 116' which are wider than the conductive line 118A or 118B may still separate the magnetic element 109 from the conductive lines 118A and 118B. Therefore, the magnetic element 109 may still provide the desired functions.

In some embodiments, a width ratio of the conductive line 118A or 118B to the isolation element 116' is in a range from about 0.5 to about 0.9. In some cases, if the width ratio is smaller than about 0.5, the resistance of the conductive line 118A or 118B may be high. The performance of the magnetic element 109 may be negatively affected. In some other cases, if the width ratio is greater than about 0.9, the risk that the conductive line 118A or 118B is electrically shorted with the magnetic element 109 may be high. Once the conductive line 118A or 118B comes in contact with the magnetic element 109, the magnetic element 109 may not be able to provide the desired functions.

As shown in FIG. 3D, a first edge of the conductive line 118A is laterally separated from a first edge of the isolation element 116' by a distance $d_1$. A second edge of the conductive line 118A is laterally separated from a second edge of the isolation element 116' located under the conductive line 118A by a distance $d_2$. In some embodiments, the distances $d_1$ and $d_2$ are the same. In some other embodiments, the distances $d_1$ and $d_2$ are different from each other. The distance $d_1$ or $d_2$ may be in a range from about 2 µm to about 4 µm.

In some embodiments, the conductive line 118A (or 118B) and the isolation element 116' further extend over the interconnect structure 102 that is not covered by the magnetic element 109, as shown in FIG. 3D. Due to the adhesive element 103', the interconnection structure 102 may be prevented from being damaged because of the high stress from the isolation element 116'. As shown in FIG. 3D, an end of the conductive line 118A (or 118B) is laterally separated from an edge of the magnetic element 109 by a distance L. In some embodiments, the distance L is in a range from about 4 µm to about 6 µm.

In some cases, if the distance L is less than about 4 µm, the performance and quality of the magnetic element 109 may be negatively affected. For example, if an overlay shift occurs during the formation of the conductive line 118A (or 118B), the sidewall surface of the isolation element 109 may not be covered by the conductive line 118A (or 118B). That is, the conductive line 118A (or 118B) may not extend across the magnetic element 109, which may lead to lower efficiency of the magnetic element 109. In some other cases, if the distance L is greater than about 6 µm, stress between the conductive line 118A (or 118B) and a subsequently formed dielectric layer may be increased. There may be a risk that the conductive line 118A (or 118B) would be damaged or broken.

Figure 1M:
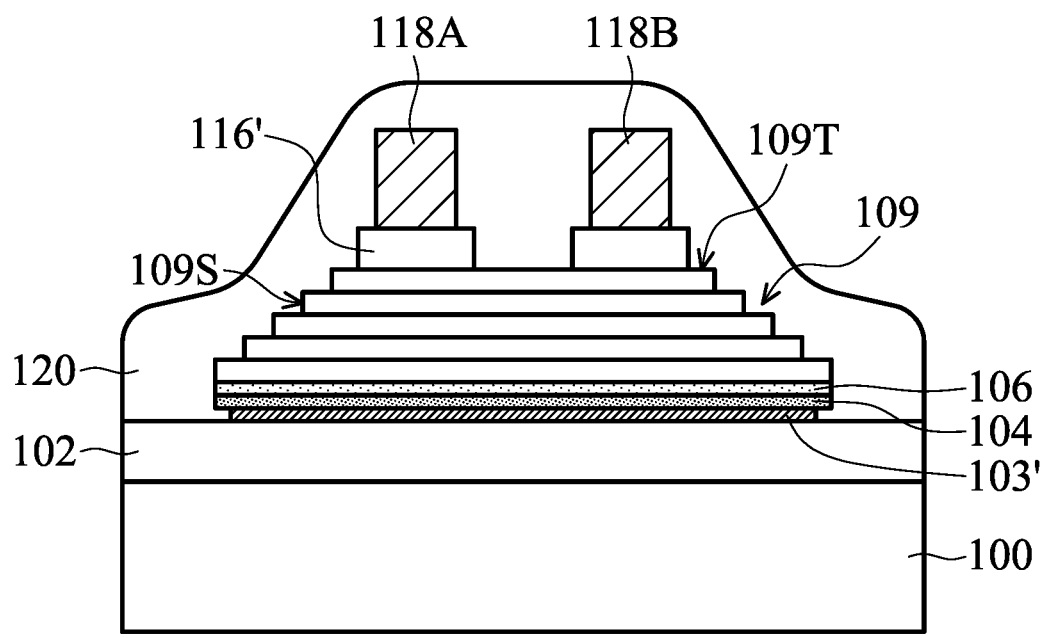
Figure 2E:
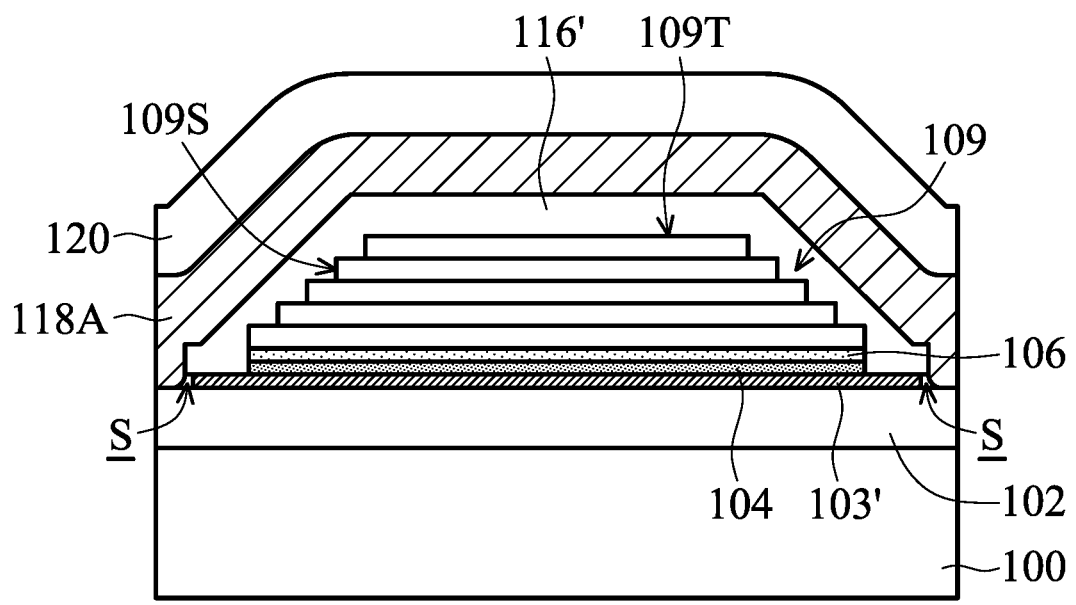

As shown in FIGS. 1M and 2E, a dielectric layer 120 is formed over the conductive lines 118A and 118B, the isolation elements 116', and the magnetic element 109, in accordance with some embodiments. In some embodiments, the dielectric layer 120 is directly deposited over the conductive lines 118A and 118B, the isolation elements 116', and the magnetic element 109. In some embodiments, the dielectric layer 120 is in direct contact with the isolation elements 116', the conductive lines 118A and 118B, and the magnetic element 109.

In some embodiments, the dielectric layer 120 is made of or includes a polymer material. The polymer material may include PBO, epoxy resin, polyimide, one or more other suitable materials, or a combination thereof. The dielectric layer 120 may be formed using a spin coating process, a spray coating process, an injecting process, a molding process, one or more other suitable processes, or a combination thereof.

In some embodiments, the formation of the dielectric layer 120 involves a thermal operation. For example, a polymer-containing material is cured at a high temperature to form the dielectric layer 120. Therefore, a high thermal stress may be generated during the formation of the dielectric layer 120. As shown in FIG. 3D, the exposed portions of the isolation elements 116' are minimized, in accordance with some embodiments. The contact area between the isolation elements 116' and the dielectric layer 120 is small. The thermal stress applied on the isolation elements 116' is therefore reduced.

The adhesive element 103' may also help to affix the isolation elements 116' and the interconnection structure 102. Therefore, the isolation elements 116' and the conductive line 118A (or 118B) thereon are prevented from being damaged or broken by the thermal stress from the dielectric layer 120. The quality and reliability of the semiconductor device structure as illustrated in FIG. 1M are significantly improved.

Afterwards, multiple material layers and device elements may be formed over the dielectric layer 120. Then, a dicing process may be performed to separate the structure into multiple semiconductor dies or die packages that are separate from each other.

Figure 4:
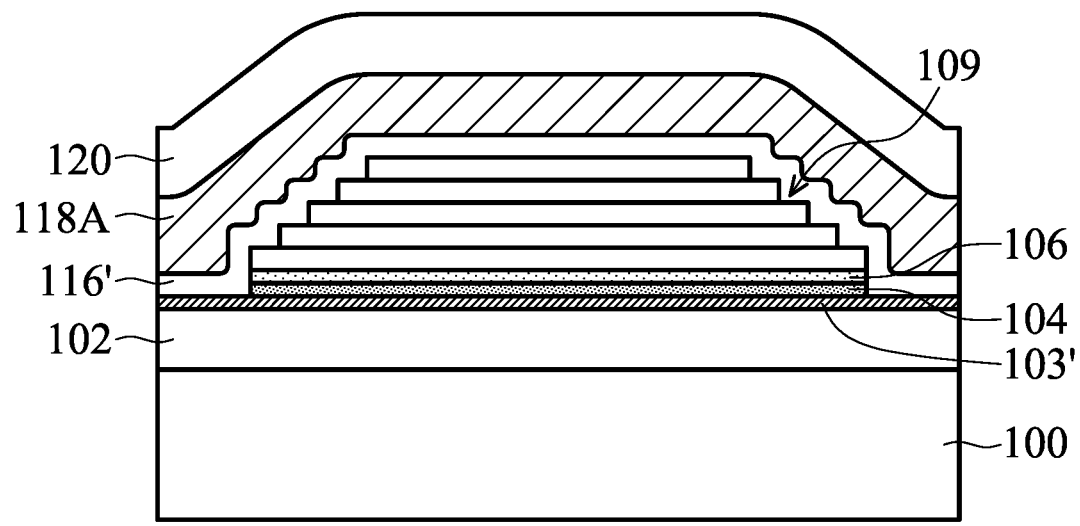
FIG. 4 is a cross-sectional view of a semiconductor device structure, in accordance with some embodiments.

Many variations and/or modifications can be made to embodiments of the disclosure. FIG. 4 is a cross-sectional view of a semiconductor device structure, in accordance with some embodiments. In some embodiments, the isolation element 116' conformally extends along the sidewall surfaces of the magnetic element 109. In these cases, both the magnetic element 109 and the isolation elements 116' have stair-like profiles, as shown in FIG. 4.

Figure 5:
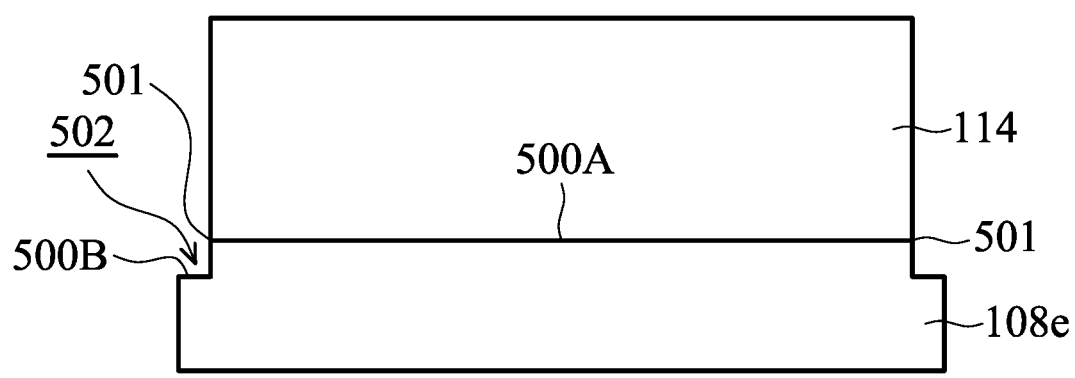
FIG. 5 is a cross-sectional view of a semiconductor device structure, in accordance with some embodiments.

FIG. 5 is a cross-sectional view of a semiconductor device structure, in accordance with some embodiments. In some embodiments, FIG. 5 is an enlarged cross-sectional view showing a portion of the structure illustrated in FIG. 1F. In some embodiments, after the etching process for removing the hollow structures 112, portions of the top surface of the topmost magnetic layer 108e are recessed. As shown in FIG. 5, the magnetic layer 108e has a first portion 500A covered by the mask element 114 and a second portion 500B not covered by the mask element 114. After the etching process, the second portion 500B is recessed to a lower height level than the first portion 500A. In some embodiments, a recess 502 is formed. The recess 502 surrounds the first portion 500A.

Figure 6:
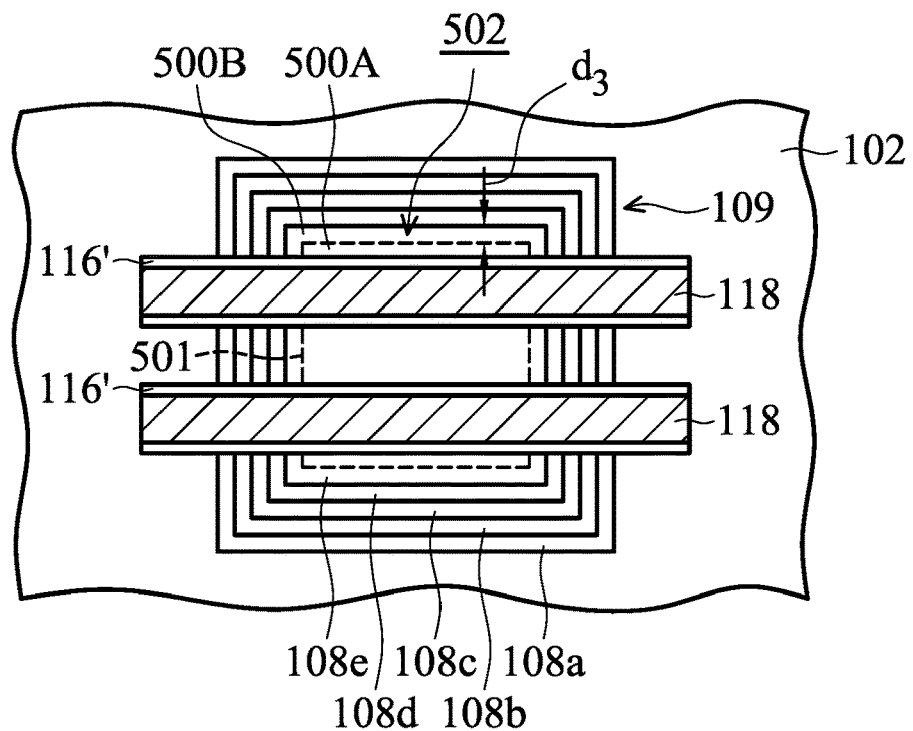
FIG. 6 is a top layout view of a semiconductor device structure, in accordance with some embodiments.

FIG. 6 is a top layout view of a semiconductor device structure, in accordance with some embodiments. In some embodiments, the recess 502 is formed due to the etching process for removing the hollow structures 112. As shown in FIG. 6, the recess has an edge 501 that defines the first portion 500A. As shown in FIG. 6, the recess 502 has a width $d_3$. In some embodiments, the width $d_3$ is in a range from about 5 μm to about 10 μm.

In some cases, if the width $d_3$ is less than about 5 μm, the etching process for removing the hollow structures 112 may be negatively affected. Once an overlay shift occurs during the formation of the mask element 114, some of the hollow structures 112 may be covered by the mask element 114. As a result, the hollow structures 112 may not be removed completely, which may result in a performance degradation of the semiconductor device structure.

Embodiments of the disclosure form an adhesive layer between a magnetic element and an interconnection structure. A patterned isolation element and a conductive line thereon are formed to extend across and partially cover the magnetic element. A dielectric layer is then formed over the magnetic element, the patterned isolation element, and the conductive line. Because the patterned isolation element has a limited contact area to the dielectric layer, the stress between the dielectric layer and the patterned isolation element is reduced. Due to the adhesive layer, the interconnection structure is prevented from being in direct contact with the patterned isolation element and damaged due to high stress of the patterned isolation element. The elements in the interconnection structure (such as a polymer layer and/or a conductive pad) are prevented from being damaged. The quality and reliability of the semiconductor device structure are significantly improved.

In accordance with some embodiments, a method for forming a semiconductor device structure is provided. The method includes forming an adhesive layer over a semiconductor substrate and forming a magnetic element over the adhesive layer. The method also includes forming an isolation element extending across the magnetic element. The isolation element partially covers the top surface of the magnetic element and partially covers sidewall surfaces of the magnetic element. The method further includes partially removing the adhesive layer such that an edge of the adhesive layer is laterally disposed between an edge of the magnetic element and an edge of the isolation element. In addition, the method includes forming a conductive line over the isolation element.

In accordance with some embodiments, a method for forming a semiconductor device structure is provided. The method includes forming a metal layer over a semiconductor substrate. The method also includes forming a magnetic element over the metal layer. The method further includes forming an isolation element directly on the magnetic element and the metal layer. In addition, the method includes forming a conductive line over the isolation element.

In accordance with some embodiments, a semiconductor device structure is provided. The semiconductor device structure includes a semiconductor substrate and a magnetic element over the semiconductor substrate. The semiconductor device structure also includes an adhesive element between the magnetic element and the semiconductor substrate. The semiconductor device structure further includes an isolation element extending across the magnetic element. The isolation element partially covers a top surface of the magnetic element and partially covers sidewall surfaces of the magnetic element. An edge of the adhesive element is laterally disposed between an edge of the magnetic element and an edge of the isolation element. In addition, the semiconductor device structure includes a conductive line over the isolation element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a magnetic element over the semiconductor substrate, wherein the magnetic element has a first edge;
   an adhesive element between the magnetic element and the semiconductor substrate, wherein the adhesive element has a second edge;
   an isolation element extending across the magnetic element, wherein the isolation element partially covers a top surface of the magnetic element and partially covers sidewall surfaces of the magnetic element, the isolation element has a third edge, and the second edge is closer to the third edge than the first edge; and
   a conductive line over the isolation element.

2. The semiconductor device structure as claimed in claim 1, wherein the second edge is laterally between the first edge and the third edge.

3. The semiconductor device structure as claimed in claim 1, wherein the adhesive element extends exceeding an interface between the magnetic element and the isolation element.

4. The semiconductor device structure as claimed in claim 1, wherein the adhesive element is in direct contact with the isolation element.

5. The semiconductor device structure as claimed in claim 1, wherein the adhesive element comprises titanium, aluminum, copper, or a combination thereof.

6. The semiconductor device structure as claimed in claim 1, further comprising a protective layer and an etch stop layer between the magnetic element and the adhesive element.

7. The semiconductor device structure as claimed in claim 1, wherein the magnetic element comprises multiple sub-layers, and each sub-layers is larger than another sub-layer above it.

8. The semiconductor device structure as claimed in claim 7, wherein a topmost sub-layer of the sub-layers has a first portion and a second portion, the second portion surrounds the first portion, and the first portion is thicker than the second portion.

9. The semiconductor device structure as claimed in claim 1, wherein the isolation element, the adhesive layer, and the conductive line together surround a hole.

10. The semiconductor device structure as claimed in claim 1, wherein the isolation element is wider than the conductive line.

11. A semiconductor device structure, comprising:
a semiconductor substrate;
a magnetic stack over the semiconductor substrate;
an isolation element extending along a top surface and sidewalls of the magnetic stack, wherein the isolation element partially covers the magnetic stack and extends exceeding an edge of the magnetic stack; and
a conductive line over the isolation element.

12. The semiconductor device structure as claimed in claim 11, further comprising an adhesive layer between the magnetic element and the semiconductor substrate.

13. The semiconductor device structure as claimed in claim 11, wherein the isolation element covers an entirety of a top surface of the adhesive layer.

14. The semiconductor device structure as claimed in claim 11, wherein the adhesive layer is separated from the conductive line by a hole.

15. The semiconductor device structure as claimed in claim 11, wherein the adhesive layer comprises titanium, aluminum, copper, or a combination thereof.

16. A semiconductor device structure, comprising:
a semiconductor substrate;
a magnetic stack over the semiconductor substrate;
an isolation element extending across the magnetic stack, wherein the magnetic stack is wider than the isolation element; and
a conductive line over the isolation element.

17. The semiconductor device structure as claimed in claim 16, wherein the conductive line partially covers the isolation element.

18. The semiconductor device structure as claimed in claim 16, further comprising an adhesive layer between the magnetic element and the semiconductor substrate.

19. The semiconductor device structure as claimed in claim 18, wherein an edge of the adhesive layer is laterally between an edge of the magnetic element and an edge of the isolation element.

20. The semiconductor device structure as claimed in claim 18, wherein the edge of the adhesive layer is closer to the edge of the isolation element than the edge of the magnetic element.

* * * * *